(12) United States Patent
Choi et al.

(10) Patent No.: US 11,847,953 B2
(45) Date of Patent: *Dec. 19, 2023

(54) DISPLAY DEVICE AND METHOD OF COMPENSATING THE SAME

(71) Applicant: LG Display Co., Ltd., Seoul (KR)

(72) Inventors: Min-Gyu Choi, Paju-si (KR); Se-Jin Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/168,343

(22) Filed: Feb. 13, 2023

(65) Prior Publication Data

US 2023/0186820 A1     Jun. 15, 2023

Related U.S. Application Data

(63) Continuation of application No. 17/538,548, filed on Nov. 30, 2021, now Pat. No. 11,605,333.

(30) Foreign Application Priority Data

Dec. 29, 2020   (KR) .......................... 10-2020-0186472

(51) Int. Cl.
*G09G 3/20* (2006.01)
*G02F 1/1343* (2006.01)
*G06T 7/60* (2017.01)

(52) U.S. Cl.
CPC ............. *G09G 3/2074* (2013.01); *G06T 7/60* (2013.01); *G02F 1/134345* (2021.01)

(58) Field of Classification Search
CPC ................... G09G 3/2074; G09G 3/32; G09G 2300/0452; G09G 3/3208; G09G 3/3291; G09G 2320/0666; G09G 3/3225; G09G 2320/0233; G06T 7/60; G06T 2207/20056; G06T 5/008; G02F 1/134345; H10K 59/122; H10K 59/352; H10K 59/353; H10K 59/351; H10K 59/1213

See application file for complete search history.

(56) References Cited

U.S. PATENT DOCUMENTS

| 10,417,955 B2 | 9/2019 | Chang |
| 2016/0293679 A1 | 10/2016 | Xu et al. |
| 2016/0315127 A1 | 10/2016 | Yoon et al. |
| 2019/0066572 A1 | 2/2019 | Chang |
| 2019/0355794 A1 | 11/2019 | Dai et al. |

FOREIGN PATENT DOCUMENTS

| CN | 1637560 A | 7/2005 |
| CN | 107305905 A | 10/2017 |
| CN | 107342039 A | 11/2017 |
| CN | 109565916 A | 4/2019 |

(Continued)

*Primary Examiner* — Ricardo Osorio
(74) *Attorney, Agent, or Firm* — Fenwick & West LLP

(57) ABSTRACT

A display device includes: a substrate having red, first green, second green and blue subpixels; a driving thin film transistor in each of the red, first green, second green and blue subpixels on the substrate; and a light emitting diode connected to the driving thin film transistor and in each of the red, first green, second green and blue subpixels, wherein the light emitting diodes of the red, first green, second green and blue subpixels includes red, first green, second green and blue emission areas, respectively, and wherein the first green emission area has a cross shape.

4 Claims, 20 Drawing Sheets

(56) References Cited

FOREIGN PATENT DOCUMENTS

| | | |
|---|---|---|
| CN | 112736119 A | 4/2021 |
| CN | 111029389 B | 6/2022 |
| EP | 0625859 A1 | 11/1994 |
| KR | 10-2005-0077960 A | 8/2005 |
| KR | 10-1941801 B1 | 1/2019 |
| KR | 10-2020-0096989 A | 8/2020 |

| component | original shape | horizontal direction(H) vertical direction(V) | diagonal direction(D) |
|---|---|---|---|
| spatial domain | $F_{o1}$, $EA_{g1}$, $EA_{g2}$ | $X_p$, $F_{o2}$, $X_p$ | $\sqrt{2}X_p$, $\sqrt{2}X_p$, $F_{p3}$ |
| frequency domain | (0,0) | $(F_p, 0)$ $(0, F_p)$ | $(F_p/2, F_p/2)$ |

DISPLAY DEVICE AND METHOD OF COMPENSATING THE SAME

CROSS-REFERENCE TO RELATED APPLICATION

The present application is a continuation application of U.S. patent application Ser. No. 17/538,548 filed on Nov. 30, 2021, which claims the priority benefit of Korean Patent Application No. 10-2020-0186472 filed on Dec. 29, 2020, which is hereby incorporated by reference in its entirety.

BACKGROUND

Field of the Disclosure

The present disclosure relates to a display device, and more particularly, to a display device including red, green and blue subpixels having a shape where a moiré is minimized in a camera compensation and a method of compensating the display device.

Description of the Background

As an information-oriented society progresses, demand for a display device displaying an image have increased with various forms. In a display device field, a cathode ray tube (CRT) having a relatively large volume has been rapidly replaced by a flat panel display (FPD) device having a thin profile, a light weight and applicable to a relatively large size. The FPD device includes a liquid crystal display (LCD) device, a plasma display panel (PDP), an organic light emitting diode (OLED) display device and a field emission display (FED) device.

Among the FPD devices, the OLED display device displays an image using a light emitting diode emitting a light corresponding to a data voltage. Since an emitting layer of the light emitting diode is formed of an organic material, the light emitting diode has a luminance deviation in the display panel and the luminance deviation causes deterioration such as a stain.

To solve the above problem, a camera compensation method where a positional luminance is detected by shooting a displayed image of a completed display panel with a camera and an image data is modulated to compensate a deviation of the positional luminance has been suggested.

In the camera compensation method, a shot photograph image has an interference fringe such as a moiré due to an interference between a plurality of subpixels of the display panel and a plurality of sensors of the camera, and deterioration such as a real stain of the display panel may not be compensated due to the interference fringe.

To prevent occurrence of the interference fringe such as a moiré, the camera compensation method is performed in a range where a modulation transfer function (MTF) representing reproducibility of the shot photographic image with respect to the original displayed image has a relatively low value. Since the exact photographic image is not obtained, a compensation performance is reduced. As a result, a minute stain of the display panel is not normally compensated.

SUMMARY

Accordingly, the present disclosure is directed to a display device that substantially obviates one or more of the problems due to limitations and disadvantages of the related art.

Also, the present disclosure is to provide a display device where a high frequency component of a moiré frequency is reduced, a moiré is eliminated, and a minute stain is compensated due to an emission area of a green subpixel of a cross shape having an increased width along horizontal and vertical directions and a method of compensating the display device.

In addition, the present disclosure is to provide a display device where a high frequency component of a moiré frequency is reduced, a frequency component of an original frequency along horizontal and vertical directions is reduced, a moiré is eliminated, and a minute stain is compensated due to an emission area of a green subpixel of a cross shape having an increased width along horizontal and vertical directions and a green subpixel of a slanted cross shape and a method of compensating the display device.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a display device includes: a substrate having red, first green, second green and blue subpixels; a driving thin film transistor in each of the red, first green, second green and blue subpixels on the substrate; and a light emitting diode connected to the driving thin film transistor and in each of the red, first green, second green and blue subpixels, wherein the light emitting diodes of the red, first green, second green and blue subpixels includes red, first green, second green and blue emission areas, respectively, and wherein the first green emission area has a cross shape.

In another aspect, a method of compensating a display device includes: displaying a displayed image using the display device including red, first green, second green and blue subpixels; generating a photographic image by shooting the displayed image using a camera including a plurality of sensors; eliminating a moiré from the photographic image using a panel frequency calculated from a panel period of the first green and second green subpixels and a sensor frequency calculated from a sensor period of the plurality of sensors; calculating a luminance compensation value by comparing a measured luminance of the photographic image with a target luminance; and generating a compensated image data by applying the luminance compensation value to an image data.

In still another aspect, a display device comprises first subpixels, second subpixels, and third subpixels each emitting light of a first color, a second color, and a third color, respectively; and a corresponding light emitting diode each disposed in each of the first, second, and third subpixels and each having first color emission area, a second color emission area, a third color emission area, respectively, wherein the first color emission area and the second color emission area have a square shape and the third color emission area have a cross shape.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate aspects of the disclosure and together with the description serve to explain the principles of the disclosure.

In the drawings.

DETAILED DESCRIPTION

Figure 1:
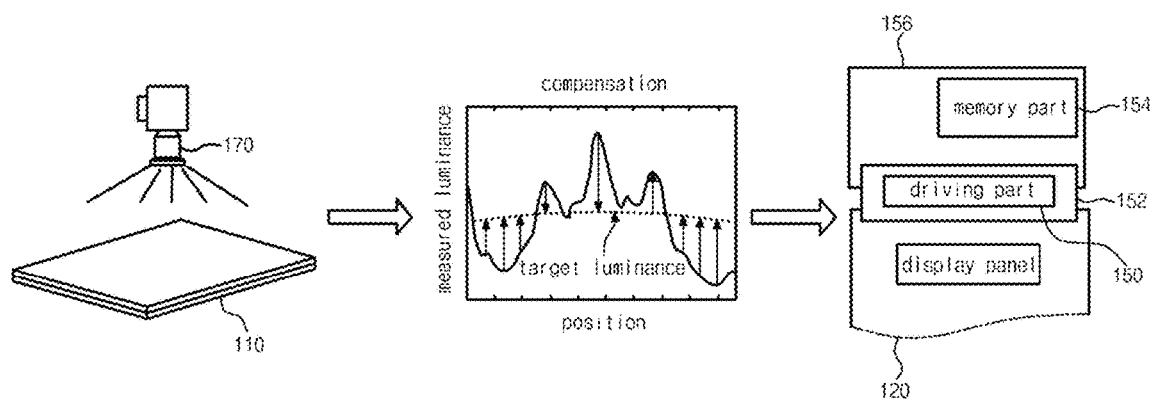
FIG. 1 is a view showing a method of compensating a display device according to a first embodiment of the present disclosure.

Reference will now be made in detail to aspects of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following example aspects described with reference to the accompanying drawings. The present disclosure may, however, be embodied in different forms and should not be construed as limited to the example aspects set forth herein. Rather, these example aspects are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing aspects of the present disclosure are merely an example. Thus, the present disclosure is not limited to the illustrated details. Same reference numerals refer to same elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used.

In describing a time relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of aspects, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and aspects of the present disclosure are not limited thereto.

Features of various aspects of the present disclosure may be partially or overall coupled to or combined with each other, and may be variously inter-operated with each other and driven technically as those skilled in the art can sufficiently understand. Aspects of the present disclosure may be carried out independently from each other, or may be carried out together in co-dependent relationship.

Reference will now be made in detail to the present disclosure, examples of which are illustrated in the accompanying drawings.

FIG. 1 is a view showing a method of compensating a display device according to a first embodiment of the present disclosure. The display device may include an organic light emitting diode (OLED) display device.

In FIG. 1, a camera 170 is disposed over a display panel 120 of a display device 110 according to a first embodiment of the present disclosure. The camera 170 shoots a displayed image of the display panel 120 to generate a photographic image including a positional measured luminance.

Next, a positional luminance compensation value is calculated by comparing the positional measured luminance with a target luminance.

For example, a positive luminance compensation value may be calculated when the measured luminance is smaller than the target luminance, and a negative luminance compensation value may be calculated when the measured luminance is greater than the target luminance.

Next, the calculated positional luminance compensation value is stored in a memory part 154 of a printed circuit board 156 of the display device 110. A driving part 150 of a flexible printed circuit 152 of the display device 110 generates a compensated image data by applying the positional luminance compensation value of the memory part 154 to an image data and supplies a data voltage according to the compensated image data to the display panel 120.

For example, the driving part 150 may generate the compensated image data by increasing a gray level of the image data corresponding to the positive positional luminance compensation value and may generate the compensated image data by decreasing a gray level of the image data corresponding to the negative positional luminance compensation value.

As a result, a luminance deviation of the display device 110 is minimized and a display quality of the image is improved through the camera compensation method.

A structure of the display panel of the display device will be illustrated hereinafter.

Figure 2:
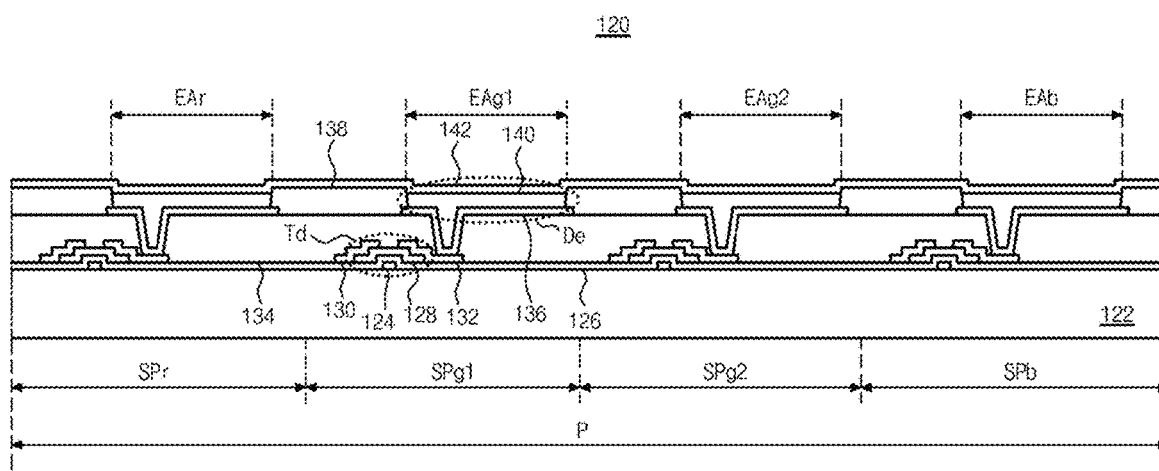
FIG. 2 is a cross-sectional view showing a display panel of a display device according to a first embodiment of the present disclosure.
Figure 3:
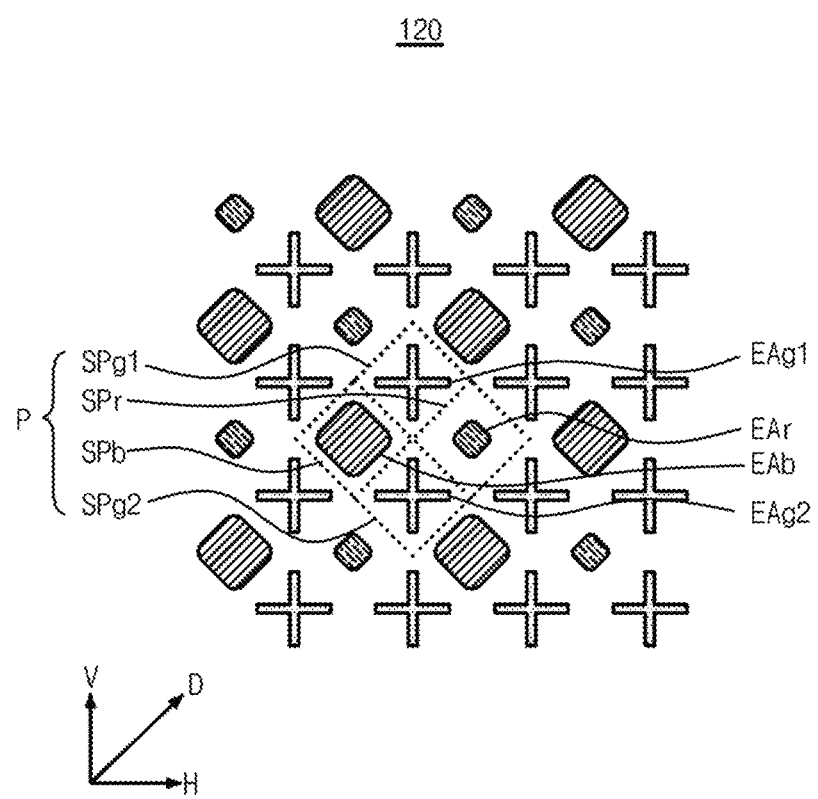
FIG. 3 is a plan view showing a display panel of a display device according to a first embodiment of the present disclosure.

FIG. 2 is a cross-sectional view showing a display panel of a display device according to a first embodiment of the present disclosure, and FIG. 3 is a plan view showing a display panel of a display device according to a first embodiment of the present disclosure.

In FIG. 2, the display panel 120 of the display device 110 according to a first embodiment of the present disclosure includes a plurality of pixels P, and each of the plurality of pixels P includes red, first green, second green and blue subpixels SPr, SPg1, SPg2 and SPb.

A gate electrode 124 is disposed in each of the red, first green, second green and blue subpixels SPr, SPg1, SPg2 and SPb on a substrate 122, and a gate insulating layer 126 is disposed on a whole of the gate electrode 124 and the substrate 122.

A semiconductor layer 128 is disposed on the gate insulating layer 126 over the gate electrode 124, and a source electrode 130 and a drain electrode 132 are disposed on both end portions of the semiconductor layer 128.

The gate electrode 124, the semiconductor layer 128, the source electrode 130 and the drain electrode 132 constitute a driving thin film transistor (TFT) Td.

Although not shown, a plurality of the TFTs having the same structure as the driving TFT Td may be disposed in each of the red, first green, second green and blue subpixels SPr, SPg1, SPg2 and SPb.

A passivation layer 134 is disposed on a whole of the driving TFT Td and the gate insulating layer 126, and a first electrode 136 is disposed in each of the red, first green, second green and blue subpixels SPr, SPg1, SPg2 and SPb on the passivation layer 134.

The passivation layer 134 has a contact hole exposing the drain electrode 132 of the driving TFT Td, and the first electrode 136 is connected to the drain electrode 132 of the driving TFT Td through the contact hole of the passivation layer 134.

A bank layer 138 is disposed on the first electrode 136. The bank layer 136 covers an edge portion of the first electrode 136 and has an opening exposing a central portion of the first electrode 136. An emitting layer 140 is disposed on the first electrode 136 exposed through the opening of the bank layer 138.

The emitting layer 140 may be formed of an organic material and may include a hole injecting layer, a hole transporting layer, an emitting material layer, an electron transporting layer and an electron injecting layer.

A second electrode 142 is disposed on a whole of the emitting layer 140 and the bank layer 138.

The first electrode 136, the emitting layer 140 and the second electrode 142 constitute a light emitting diode De.

In the light emitting diode De of the display panel 120, the first electrode 136 and the second electrode 142 supply a hole and an electron, respectively, to the emitting layer 140, and the emitting layer 140 emits a light using the hole and the electron.

Since the emitting layer 140 is disposed in the opening of the bank layer 138, the emitting layers 140 of the red, first green, second green and blue subpixels SPr, SPg1, SPg2 and SPb corresponding to the opening of the bank layer 140 may be defined as red, first green, second green and blue emission areas EAr, EAg1, EAg2 and EAb.

In FIG. 3, the display panel 120 of the display device 110 according to a first embodiment of the present disclosure includes a plurality of pixels P, and each of the plurality of pixels P includes red, first green, second green and blue subpixels SPr, SPg1, SPg2 and SPb.

For example, the pixel P may have a lozenge shape, and each of the red, first green, second green and blue subpixels SPr, SPg1, SPg2 and SPb may have a lozenge shape obtained by quadrisecting each pixel P.

The red subpixel SPr may be disposed at a right vertex portion of the lozenge shape of the pixel P, and the first green subpixel SPg1 may be disposed at a top vertex portion of the lozenge shape of the pixel P. The second green subpixel SPg2 may be disposed at a bottom vertex portion of the lozenge shape of the pixel P, and the blue subpixel SPg1 may be disposed at a left vertex portion of the lozenge shape of the pixel P.

The red, first green, second green and blue subpixels SPr, SPg1, SPg2 and SPb include the red, first green, second green and blue emission areas EAr, EAg1, EAg2 and EAb, respectively.

Each of the red and blue emission areas EAr and EAb has a lozenge shape or a square shape slanted along a diagonal direction D.

Each of the first green and second green emission areas EAg1 and EAg2 has a cross shape or a shape of two bars disposed along a horizontal direction H and a vertical direction V and crossing each other.

For example, the red emission area EAr may have an area smaller than an area of the blue emission area EAb, and the first green and second green emission areas EAg1 and EAg2 may have the same area as each other.

In the display panel 120, since widths along the horizontal direction H and the vertical direction V of the first green and second green emission areas EAg1 and EAg2 increases, a second frequency component of an original frequency is reduced. As a result, a high frequency component of a moiré frequency is reduced such that a moiré is eliminated, and a minute stain is compensated.

In another embodiment, a high frequency component of a moiré frequency may be further reduced by increasing randomness of the first green and second green subpixels.

Figure 4:
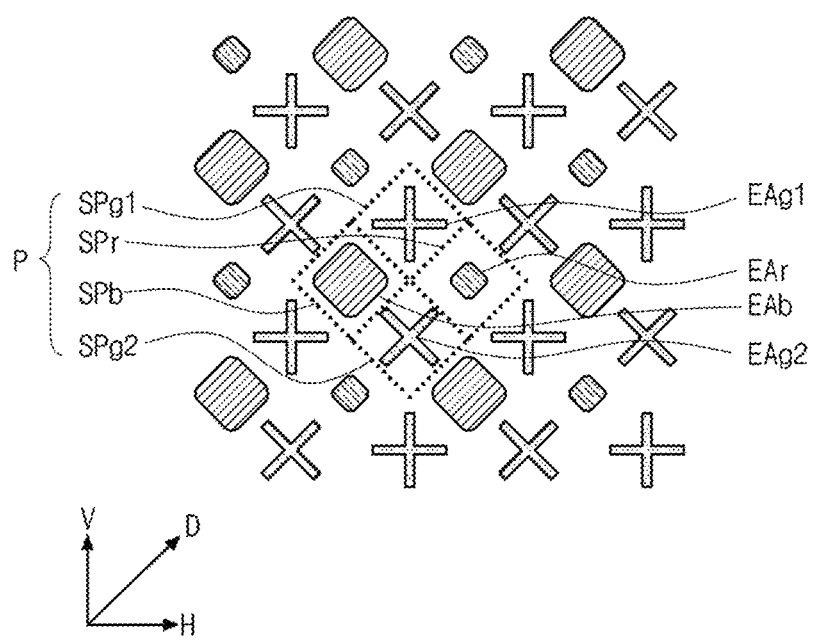
FIG. 4 is a plan view showing a display panel of a display device according to a second embodiment of the present disclosure.

FIG. 4 is a plan view showing a display panel of a display device according to a second embodiment of the present disclosure. Illustration of a part the same as a part of the first embodiment will be omitted.

In FIG. 4, a display panel 220 of a display device according to a second embodiment of the present disclosure includes a plurality of pixels P, and each of the plurality of pixels P includes red, first green, second green and blue subpixels SPr, SPg1, SPg2 and SPb.

For example, the pixel P may have a lozenge shape, and each of the red, first green, second green and blue subpixels SPr, SPg1, SPg2 and SPb may have a lozenge shape obtained by quadrisecting each pixel P.

The red subpixel SPr may be disposed at a right vertex portion of the lozenge shape of the pixel P, and the first green subpixel SPg1 may be disposed at a top vertex portion of the lozenge shape of the pixel P. The second green subpixel SPg2 may be disposed at a bottom vertex portion of the lozenge shape of the pixel P, and the blue subpixel SPg1 may be disposed at a left vertex portion of the lozenge shape of the pixel P.

The red, first green, second green and blue subpixels SPr, SPg1, SPg2 and SPb include the red, first green, second green and blue emission areas EAr, EAg1, EAg2 and EAb, respectively.

Each of the red and blue emission areas EAr and EAb has a lozenge shape or a square shape slanted along a diagonal direction D.

The first green emission area EAg1 has a cross shape or a shape of two bars disposed along a horizontal direction H and a vertical direction V and crossing each other, and the second green emission area EAg2 has a cross shape slanted along a diagonal direction D or a shape of two bars disposed along a diagonal direction D and crossing each other.

For example, the red emission area EAr may have an area smaller than an area of the blue emission area EAb, and the first and second green emission areas EAg1 and EAg2 may have the same area as each other.

In the display panel 220, since widths along the horizontal direction H and the vertical direction V of the first green emission area EAg1 increases, a second frequency component of an original frequency is reduced. As a result, a high frequency component of a moiré frequency is reduced such that a moiré is eliminated, and a minute stain is compensated.

In addition, since randomness of the first green and second green emission areas EAg1 and EAg2 increases due to their positioning in different directions, a high frequency component of a moiré frequency is further reduced such that a moiré is eliminated, and a minute stain is compensated.

In the present disclosure, an original frequency and a moiré frequency are calculated from a spatial frequency of a plurality of subpixels of a display panel and a spatial frequency of a plurality of sensors of a camera, and a moiré is eliminated using the original frequency and the moiré frequency.

Among the red, green and blue subpixels, the green subpixel has a relatively high luminance to act as the biggest cause of a moiré. Accordingly, the green subpixel will be illustrated as a reference hereinafter.

Figure 5A:
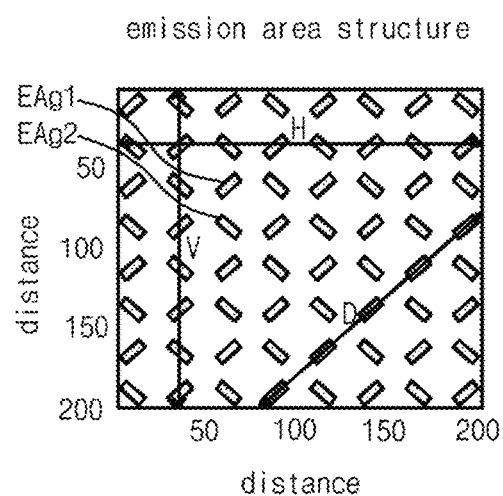
FIGS. 5A, 5B and 5C are views showing an emission area structure, a luminance profile and a frequency domain, respectively, of a subpixel of a first comparison example.
Figure 5B:
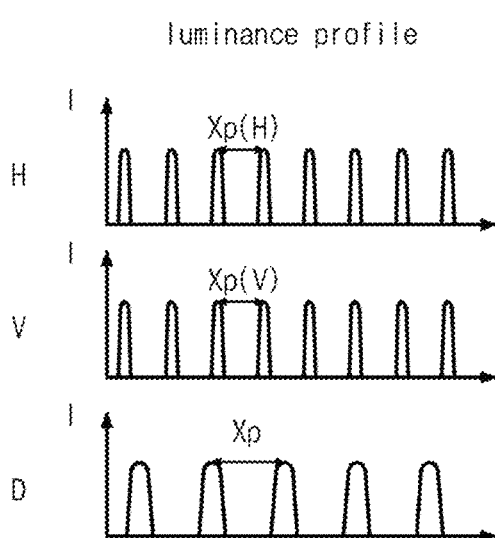
Figure 5C:
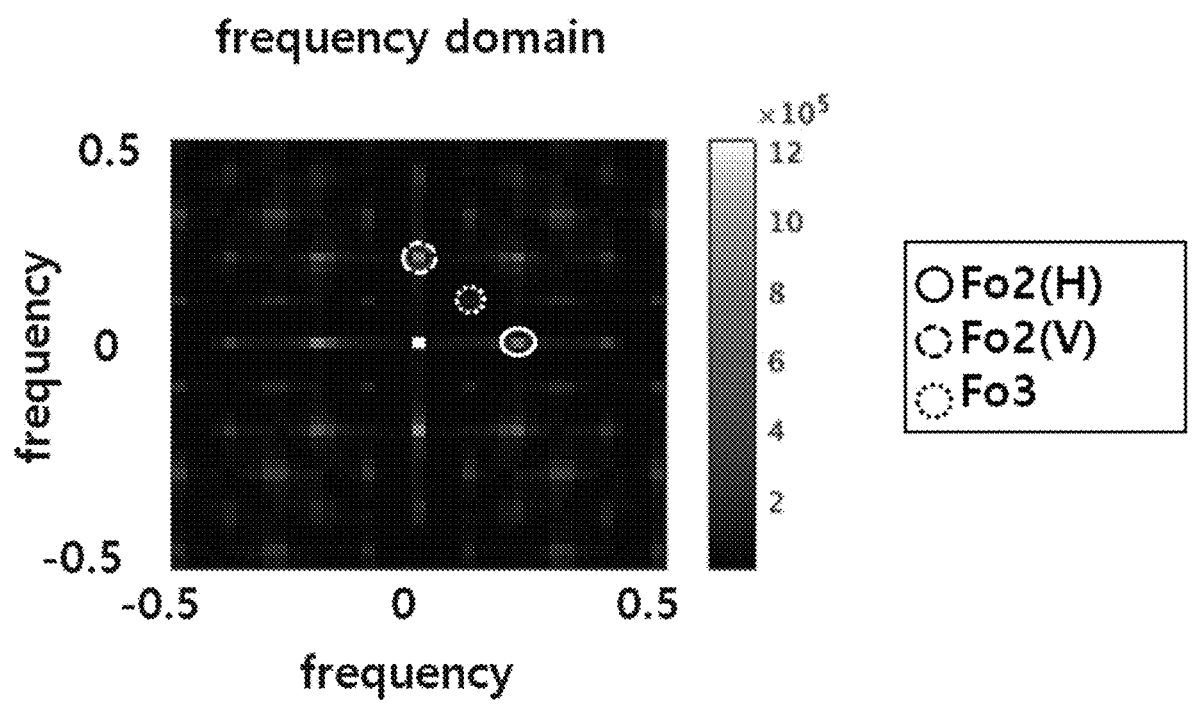

FIGS. 5A, 5B and 5C are views showing an emission area structure, a luminance profile and a frequency domain, respectively, of a subpixel of a first comparison example.

In FIG. 5A, a first green emission area EAg1 of a first green subpixel SPg1 of a first comparison example has a bar shape disposed along a diagonal direction D of +45 degree, and a second green emission area EAg2 of a second green subpixel SPg2 of a first comparison example has a bar shape disposed along a diagonal direction D of −45 degree.

In FIG. 5B, the luminance of lights emitted from the first green and second green emission areas EAg1 and EAg2 have peaks repeated with panel periods Xp(H), Xp(V) and Xp along horizontal, vertical and diagonal directions H, V and D in the spatial domain of the emission area structure.

The panel periods Xp(H), Xp(V) and Xp representing repeatability in a spatial domain may be expressed as panel frequencies (spatial frequencies) Fp in a frequency domain through a Fourier transform. The panel frequencies Fp are reciprocal numbers of the panel periods Xp(H), Xp(V) and Xp and mean a number of repetition of the luminance peaks per unit distance in spatial frequencies Fp.

Although not shown, the camera 170 may include a plurality of sensors arranged in a matrix. The plurality of sensors may be repeated with a sensor period Ts along the horizontal, vertical and diagonal directions H, V and D, and the sensor period Ts may be expressed as a sensor frequency Fs through a Fourier transform.

In FIG. 5C, second original frequencies Fo2(H) and Fo2(V) of the horizontal and vertical directions H and V and a third original frequency Fo3 of the diagonal direction D may be calculated from the panel frequency Fp of the display panel 110 and the sensor frequency Fs of the camera 170.

In the first comparison example, the second original frequencies Fo2(H) and Fo2(V) of the horizontal and vertical directions H and V are disposed on an X frequency axis Fx and a Y frequency axis Fy, respectively, and the third original frequency Fo3 of the diagonal direction D is disposed on a straight line of the diagonal direction.

Figure 6A:
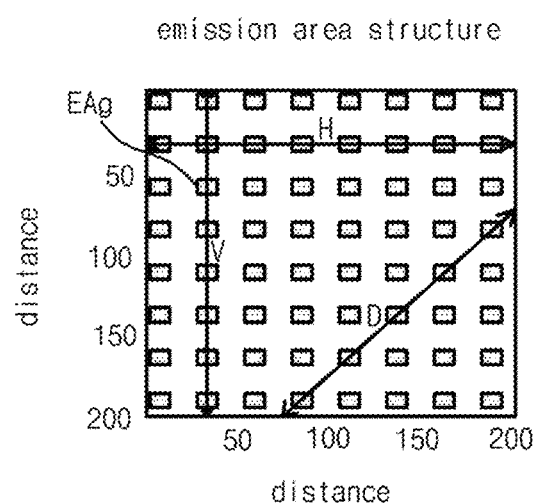
FIGS. 6A, 6B and 6C are views showing an emission area structure, a luminance profile and a frequency domain, respectively, of a subpixel of a second comparison example.
Figure 6B:
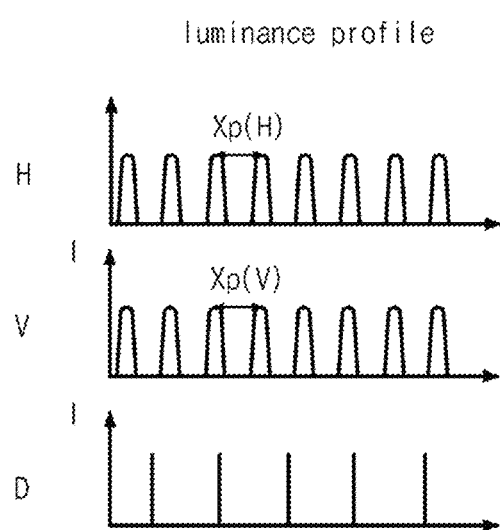
Figure 6C:
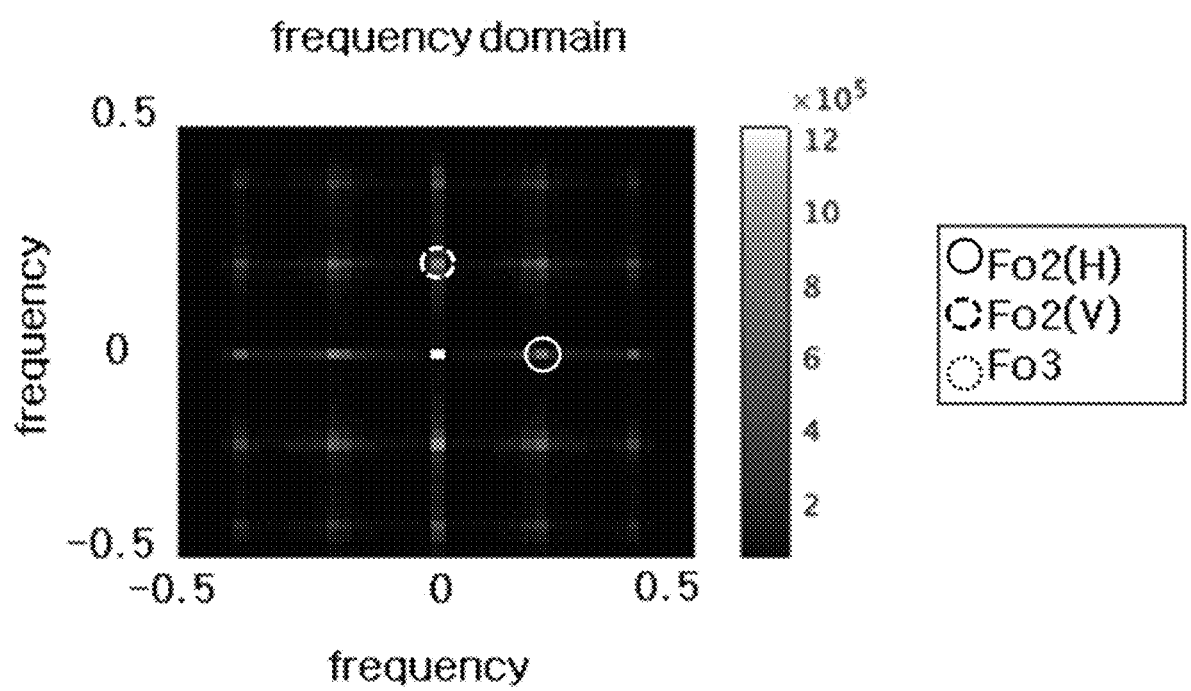

FIGS. 6A, 6B and 6C are views showing an emission area structure, a luminance profile and a frequency domain, respectively, of a subpixel of a second comparison example.

In FIG. 6A, a green emission area EAg of a green subpixel SPg of a second comparison example has a square shape disposed along horizontal and vertical directions H and V.

In FIG. 6B, a luminance of a light emitted from the green emission area EAg has peaks repeated with panel periods Xp(H) and Xp(V) along horizontal and vertical directions H and V in the spatial domain of the emission area structure. Since the luminance of the light emitted from the green emission area EAg has relatively narrow peaks along a diagonal direction D, the peaks along a diagonal direction D have relatively weak repeatability and a panel period along a diagonal direction D is not defined.

In FIG. 6C, second original frequencies Fo2(H) and Fo2(V) of the horizontal and vertical directions H and V may be calculated from the panel frequency Fp of the display panel 110 and the sensor frequency Fs of the camera 170.

Since the panel period along the diagonal direction D is not defined, a third original frequency Fo3 along the diagonal direction D is not calculated.

In the second comparison example, the second original frequencies Fo2(H) and Fo2(V) of the horizontal and vertical directions H and V are disposed on an X frequency axis Fx and a Y frequency axis Fy, respectively.

Figure 7A:
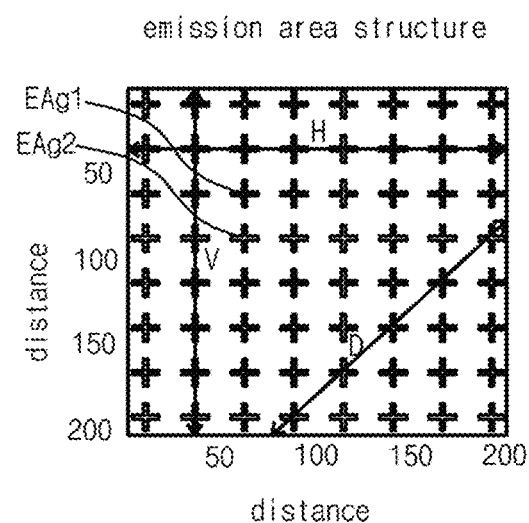
FIGS. 7A, 7B and 7C are views showing an emission area structure, a luminance profile and a frequency domain, respectively, of a subpixel according to a first embodiment of the present disclosure.
Figure 7B:
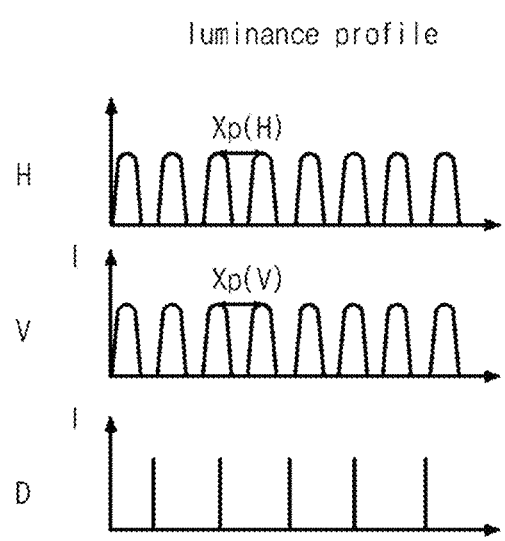
Figure 7C:
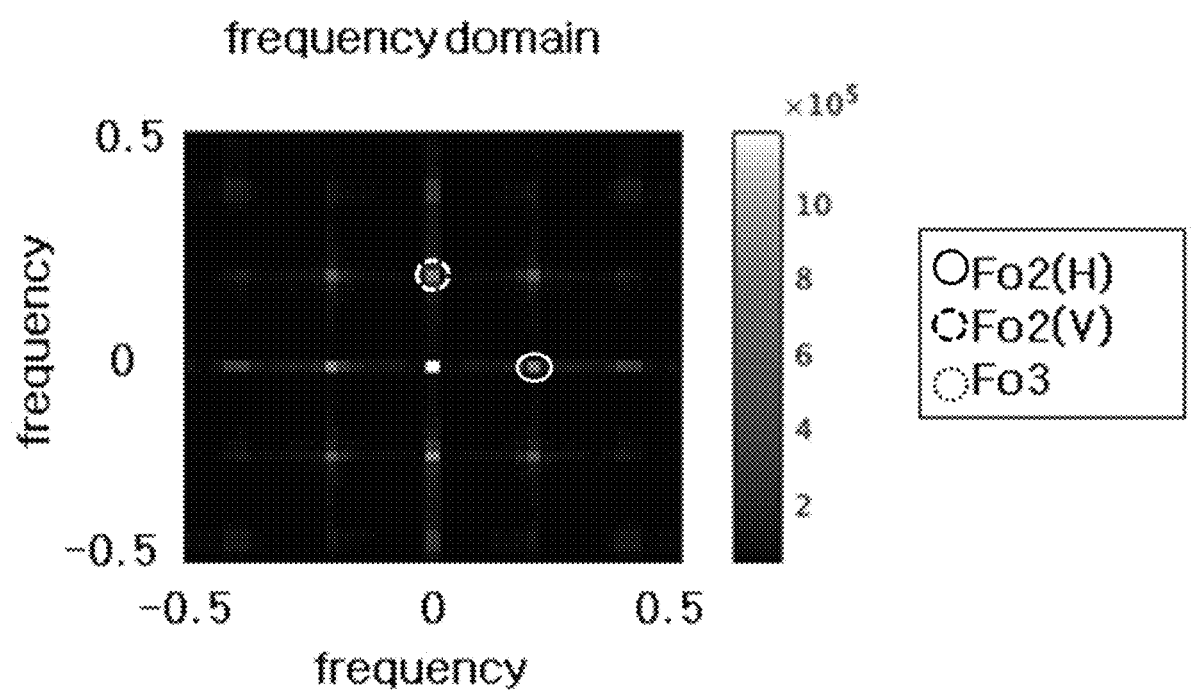

FIGS. 7A, 7B and 7C are views showing an emission area structure, a luminance profile and a frequency domain, respectively, of a subpixel according to a first embodiment of the present disclosure.

In FIG. 7A, each of first green and second green emission areas EAg1 and EAg2 of first green and second green subpixels SPg1 and SPg2 according to a first embodiment of the present disclosure has a cross shape or a shape of two crossing bars disposed along horizontal and vertical directions H and V.

In FIG. 7B, luminance of lights emitted from the first green and second green emission areas EAg1 and EAg2 have peaks repeated with panel periods Xp(H) and Xp(V) along horizontal and vertical directions H and V in the spatial domain of the emission area structure. Since the luminance of the lights emitted from the first green and second green emission areas EAg1 and EAg2 have relatively narrow peaks along a diagonal direction D, the peaks along a diagonal direction D have relatively weak repeatability and a panel period along a diagonal direction D is not defined.

In FIG. 7C, second original frequencies Fo2(H) and Fo2(V) of the horizontal and vertical directions H and V may be calculated from the panel frequency Fp of the display panel 110 and the sensor frequency Fs of the camera 170.

Since the panel period along the diagonal direction D is not defined, a third original frequency Fo3 along the diagonal direction D is not calculated.

In the first embodiment of the present disclosure, the second original frequencies Fo2(H) and Fo2(V) of the horizontal and vertical directions H and V are disposed on an X frequency axis Fx and a Y frequency axis Fy, respectively.

Figure 8A:
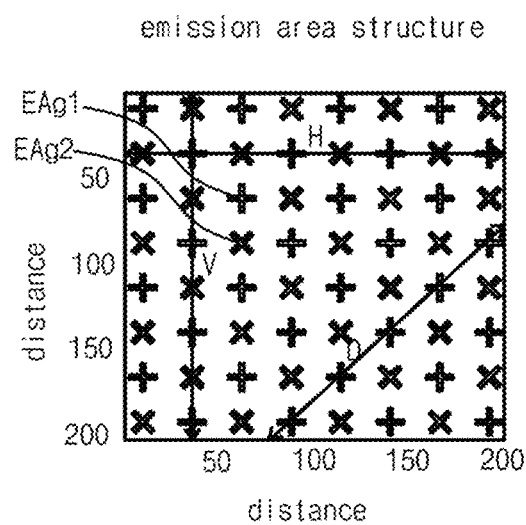
FIGS. 8A, 8B and 8C are views showing an emission area structure, a luminance profile and a frequency domain, respectively, of a subpixel according to a second embodiment of the present disclosure.
Figure 8B:
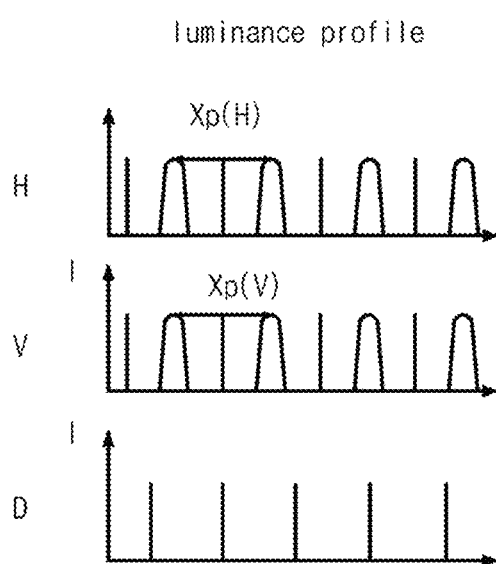
Figure 8C:
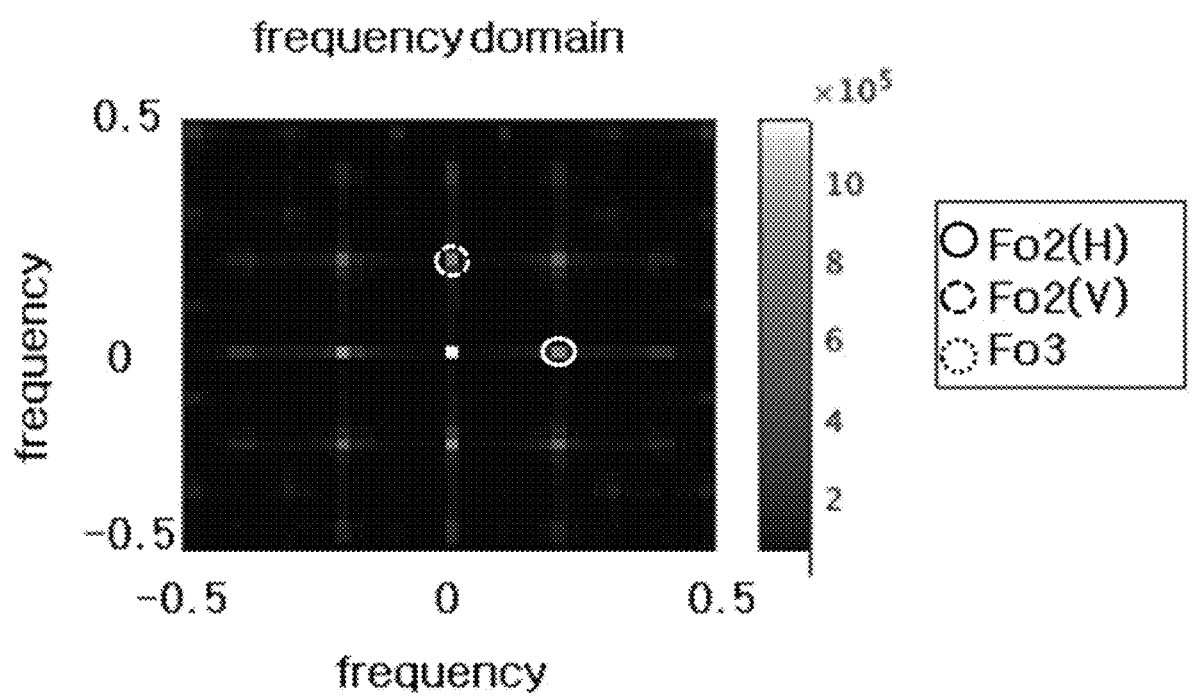

FIGS. 8A, 8B and 8C are views showing an emission area structure, a luminance profile and a frequency domain, respectively, of a subpixel according to a second embodiment of the present disclosure.

In FIG. 8A, a first green emission area EAg1 of a first green subpixel SPg1 according to a second embodiment of the present disclosure has a cross shape or a shape of two crossing bars disposed along horizontal and vertical directions H and V, and a second green emission area EAg2 of a second green subpixel SPg2 according to a second embodiment of the present disclosure has a slanted cross shape or a shape of two slanted crossing bars disposed along horizontal and vertical directions H and V.

In FIG. 8B, luminance of lights emitted from the first green and second green emission areas EAg1 and EAg2 have first peaks repeated with panel periods Xp(H) and Xp(V) along horizontal and vertical directions H and V and second peaks each having a relatively narrow width in the spatial domain of the emission area structure. The luminance of the lights emitted from the first green and second green emission areas EAg1 and EAg2 have relatively narrow peaks along a diagonal direction D.

As a result, the second peaks along horizontal and vertical directions H and V and the peaks along a diagonal direction D have relatively weak repeatability, and a panel period corresponding to the second peaks along horizontal and vertical directions H and V and the peaks along a diagonal direction D is not defined.

In FIG. 8C, second original frequencies Fo2(H) and Fo2(V) of the horizontal and vertical directions H and V may be calculated from the panel frequency Fp of the display panel 110 and the sensor frequency Fs of the camera 170.

Since the panel period along the diagonal direction D is not defined, a third original frequency Fo3 along the diagonal direction D is not calculated.

In the second embodiment of the present disclosure, the second original frequencies Fo2(H) and Fo2(V) of the horizontal and vertical directions H and V are disposed on an X frequency axis Fx and a Y frequency axis Fy, respectively.

A method of calculating an original frequency and a moiré frequency will be illustrated with reference to drawings.

Figures 9A, 9B:
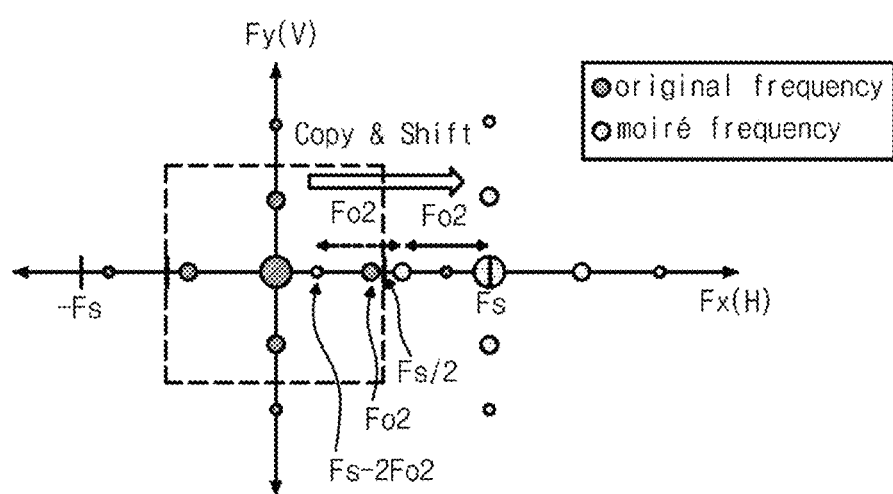
FIG. 9A is a view showing an emission area structure and a coordinate in a frequency domain of a subpixel of a first comparison example.
FIG. 9B is a view showing an original frequency and a moiré frequency of an emission area of a subpixel of a first comparison example.
Figure 9C:
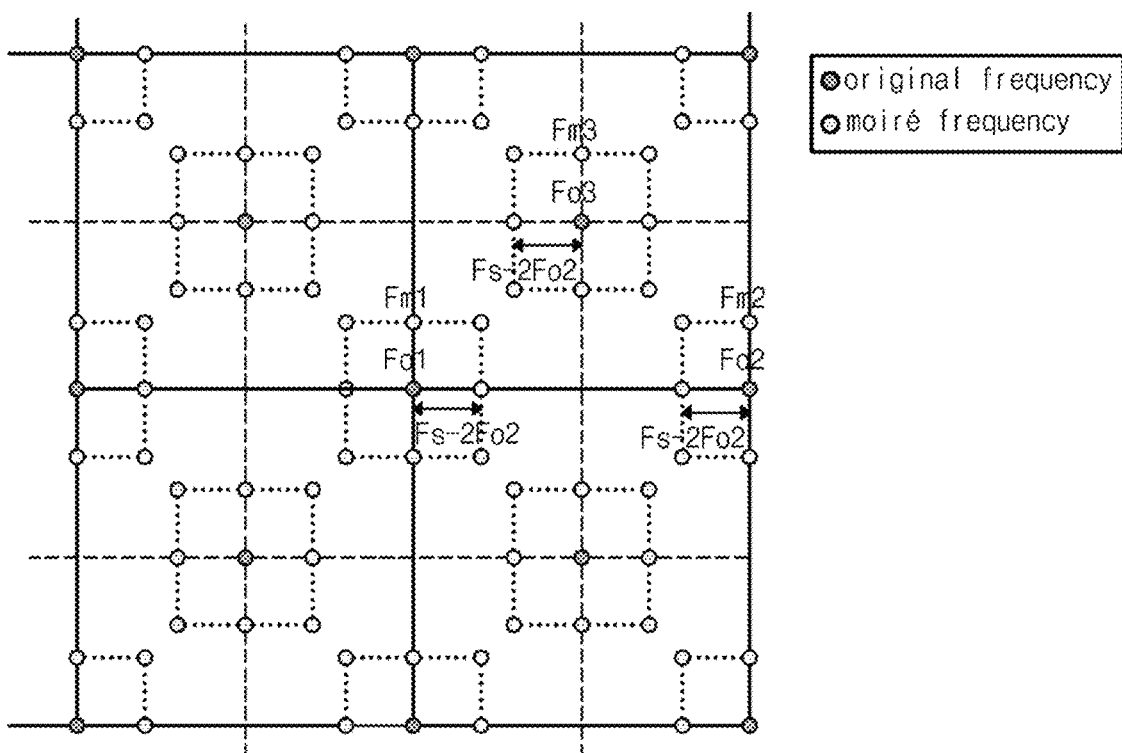
FIG. 9C is a magnified view of FIG. 9B.

FIG. 9A is a view showing an emission area structure and a coordinate in a frequency domain of a subpixel of a first comparison example, FIG. 9B is a view showing an original frequency and a moiré frequency of an emission area of a subpixel of a first comparison example, and FIG. 9C is a magnified view of FIG. 9B.

In FIG. 9A, the first green emission area EAg1 of the first green subpixel SPg1 of the first comparison example has a bar shape disposed along the diagonal direction D of +45 degree, and the second emission area EAg2 of the second green subpixel SPg2 of the first comparison example has a bar shape disposed along the diagonal direction D of −45 degree in the spatial domain of the emission area structure.

The first green and second green emission areas EAg1 and EAg2 have a horizontal vertical panel period Xp along the horizontal and vertical directions H and V and have a diagonal period of √2 times the horizontal vertical panel period Xp (i.e., √2Xp) along the diagonal direction D in the spatial domain of the emission area structure.

Original shapes of the first green and second green emission areas EAg1 and EAg2 are disposed at (0, 0) of an origin of a frequency domain and correspond to a first original frequency Fo1 defined by a following equation (1).

$$Fo1=0 \qquad \text{equation (1)}$$

Panel periods Xp along the horizontal and vertical directions H and V of the first green and second green emission areas EAg1 and EAg2 are disposed at (Fp, 0) and (0, Fp) of a frequency domain and correspond to a second original frequency Fo2 defined by a following equation (2).

$$Fo2 = Fp/Fs = 1/\text{Ratio} \quad \text{equation (2)}$$

(Fp is a panel frequency calculated through a Fourier transform of the horizontal vertical panel period (i.e., the panel period) Xp of the first green and second green emission areas EAg1 and EAg2 of the display panel, Fs is a sensor frequency calculated through a Fourier transform of a sensor period of the plurality of sensors of the camera, Ratio is a number of the plurality of sensors of the camera corresponding to one subpixel of the display panel)

The diagonal periods √2Xp along a diagonal direction D of the first green and second green emission areas EAg1 and EAg2 are disposed at (Fp/2, 0) and (0, Fp/2) of the frequency domain and correspond to a third original frequency Fo3 defined by a following equation (3).

$$Fo3 = (Fp/Fs)*(1/2) = 1/(2\text{Ratio}) \quad \text{equation (3)}$$

Since the photographic image of an analysis object is based on the plurality of sensors of the camera, the sensor frequency Fs may be set as 1, and the second original frequency Fo2 may be the same as the panel frequency Fp. (Fo2=Fp)

In FIGS. 9B and 9C, when a sampling processing (a sensing processing) is performed to the first to third original frequencies Fo1 to Fo3 according to a sampling theorem, shapes of copying and shifting the first to third original frequencies Fo1 to Fo3 are generated. The shapes generated through the sampling processing are defined as first to third moiré frequencies Fm1 to Fm3 expressed by following equations (4) to (6).

$$Fm1 = Fo1 \pm (Fs-2Fo2) = Fo1 \pm (1-(2/\text{Ratio})) \quad \text{equation (4)}$$

$$Fm2 = Fo2 \pm (Fs-2Fo2) = Fo2 \pm (1-(2/\text{Ratio})) \quad \text{equation (5)}$$

$$Fm3 = Fo2 \pm (Fs-2Fo2) = Fo3 \pm (1-(2/\text{Ratio})) \quad \text{equation (6)}$$

As a result, in the frequency domain, the first original frequency Fo1 is disposed at the origin (0, 0), the second original frequencies Fo2 are disposed at (+Fp/Fs, 0), (0, +Fp/Fs), (0, −Fp/Fs), (0, −Fp/Fs) that are separated from the first original frequency Fo1 by Fp/Fs along the X and Y frequency axes, and the third original frequencies Fo3 are disposed at (+Fp/2Fs, +Fp/2Fs), (−Fp/2Fs, +Fp/2Fs), (−Fp/2Fs, −Fp/2Fs), (+Fp/2Fs, −Fp/2Fs) that are separated from the first original frequency Fo1 by Fp/2Fs along the diagonal direction D.

In the frequency domain, the first moiré frequencies Fm1 are disposed at eight points that are separated from the first original frequency Fo1 by Fs-2Fo2 along the X and Y frequency axes and the diagonal direction D, the second moiré frequencies Fm2 are disposed at eight points that are separated from the second original frequency Fo2 by Fs-2Fo2 along the X and Y frequency axes and the diagonal direction D, and the third moiré frequencies Fm3 are disposed at eight points that are separated from the third original frequency Fo3 by Fs-2Fo2 along the X and Y frequency axes and the diagonal direction D.

In the frequency domain, the first to third moiré frequencies Fm1 to Fm3 adjacent to the first to third original frequencies Fo1 to Fo3 may cause interference fringes such as a moiré.

Occurrence of a moiré due to the first to third moiré frequencies Fm1 to Fm3 will be illustrated hereinafter.

Figure 10:
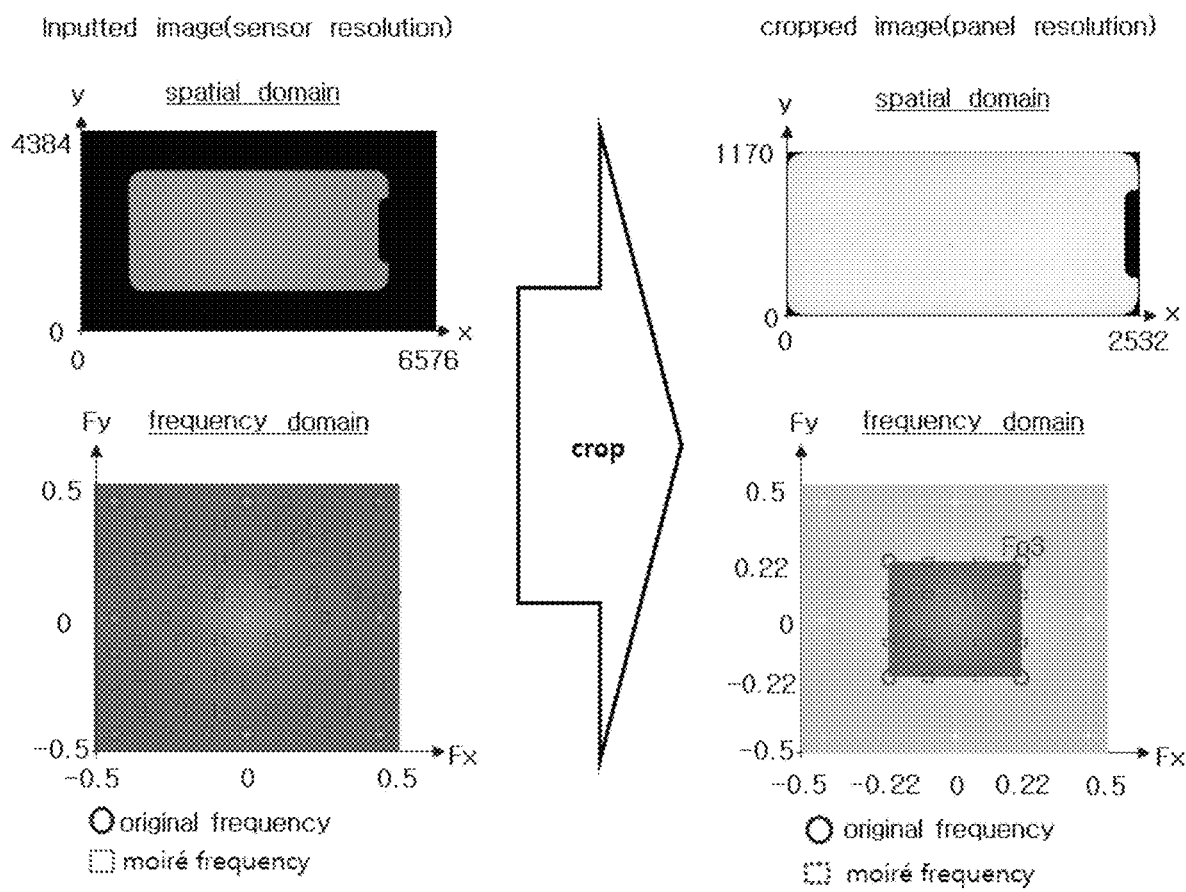
FIG. 10 is a view showing a processing of a second moiré frequency of a method of compensating a display device according to a first embodiment of the present disclosure.

FIG. 10 is a view showing a processing of a second moiré frequency of a method of compensating a display device according to a first embodiment of the present disclosure.

The processing of a second moiré frequency will be illustrated with reference to FIGS. 9A to 9C.

In FIG. 10, an inputted photographic image has a size of 6576×4384 corresponding to a resolution of the plurality of sensors of the camera 170 in a spatial domain, and the photographic image includes a displayed image of the display panel 120.

Since the photographic image outside the displayed image is not necessary, the displayed image having a size of 2532×1170 corresponding to a resolution of the first green and second green emission areas EAg1 and EAg2 of the display panel 120 remains and the other parts of the photographic image are eliminated through a crop processing.

A crop processing in a spatial domain corresponds to a low pass filtering (LPF) processing in a frequency domain.

In the frequency domain, the inputted photographic image has a first original frequency Fo1 at an origin, second original frequencies Fo2 of four points that are separated from the first original frequency Fo1 by Fp/Fs along X and Y frequency axes, and the third original frequencies Fo3 of four points that are separated from the first original frequency Fo1 by Fp/2Fs along a diagonal direction D.

In the frequency domain, the inputted photographic image has first moiré frequencies Fm1 of eight points that are separated from the first original frequency Fo1 by Fs-2Fo2 along the X and Y frequency axes, second moiré frequencies Fm2 of eight points that are separated from the first original frequency Fo1 by Fs-2Fo2 along the X and Y frequency axes and the diagonal direction D, and the third moiré frequencies Fm3 of eight points that are separated from the first original frequency Fo1 by Fs-2Fo2 along the X and Y frequency axes.

Through the crop processing, the moiré frequencies in a square including the third original frequency Fo3 corresponding to a low frequency range remain and the other moiré frequencies outside the square including the third original frequency Fo3 are eliminated.

For example, in the frequency domain, the first moiré frequencies Fm1 and a portion of the third moiré frequencies Fm3 may remain, and the second moiré frequencies Fm2 may be eliminated.

Figure 11:
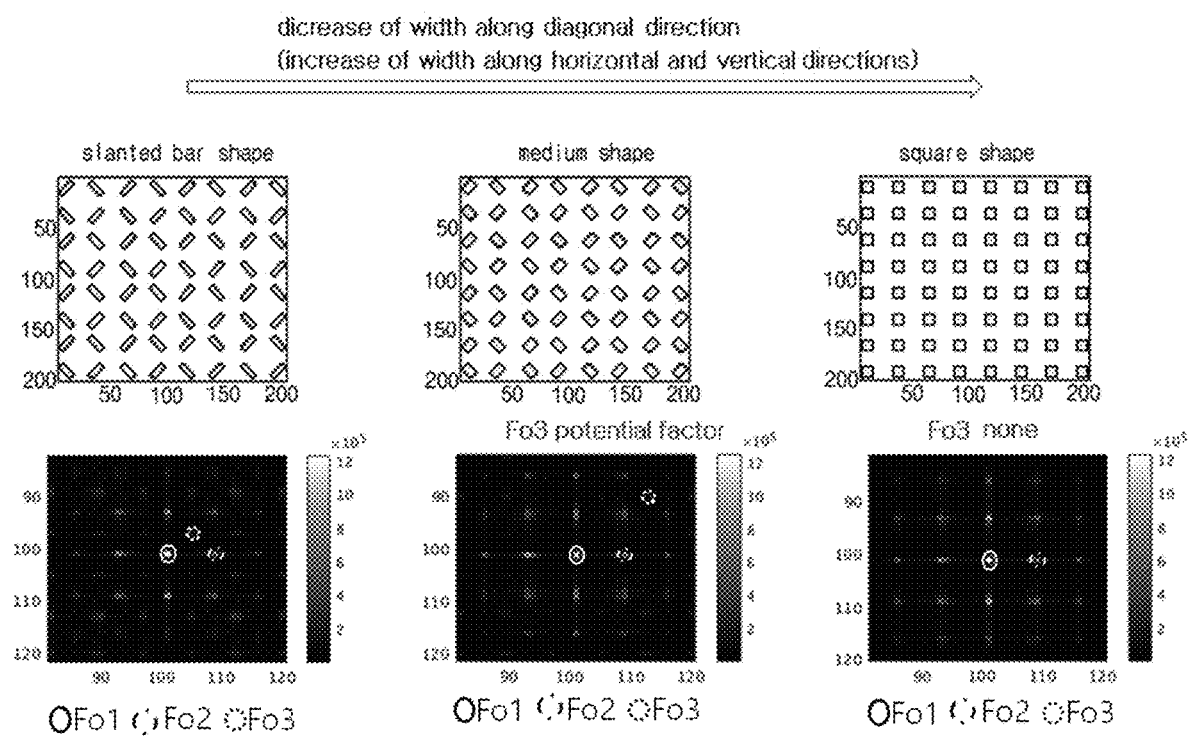
FIG. 11 is a view showing a processing of a third moiré frequency of a method of compensating a display device according to a first embodiment of the present disclosure.

FIG. 11 is a view showing a processing of a third moiré frequency of a method of compensating a display device according to a first embodiment of the present disclosure. The processing of a third moiré frequency will be illustrated with reference to FIGS. 9A to 9C.

In FIG. 11, the third moiré frequencies Fm3 are disposed at a periphery of the third original frequency Fo3 based on a width along the diagonal direction D of the green emission area of the green subpixel of the display panel 120. As a result, when the third original frequencies Fo3 are eliminated by decreasing the width along the diagonal direction D of the emission area of the subpixel, the third moiré frequencies Fm3 are also eliminated.

For example, the green emission area of the green subpixel of a slanted bar shape may have a relatively great width along the diagonal direction D, and the third original frequencies Fo3 may be disposed closest to the first original frequencies Fo1.

The green emission area of the green subpixel of a medium shape that is obtained by decreasing a width along the diagonal direction D of the green emission area of the green subpixel (increasing a width along horizontal and vertical directions of the green emission area of the green subpixel) has a decreased width along the diagonal direction D. As a result, although the third original frequencies Fo3 closest to the first original frequencies Fo1 are eliminated, the third original frequencies Fo3 next close to the first original frequencies Fo1 remain to become a potential factor of the third moiré frequencies Fm3.

The green emission area of the green subpixel of a square shape that is obtained by further decreasing a width along the diagonal direction D of the green emission area of the green subpixel (further increasing a width along horizontal and vertical directions of the green emission area of the green subpixel) has a further decreased width along the diagonal direction D. As a result, the third original frequencies Fo3 are completely eliminated such that the third moiré frequencies Fm3 are completely eliminated.

Figure 12:
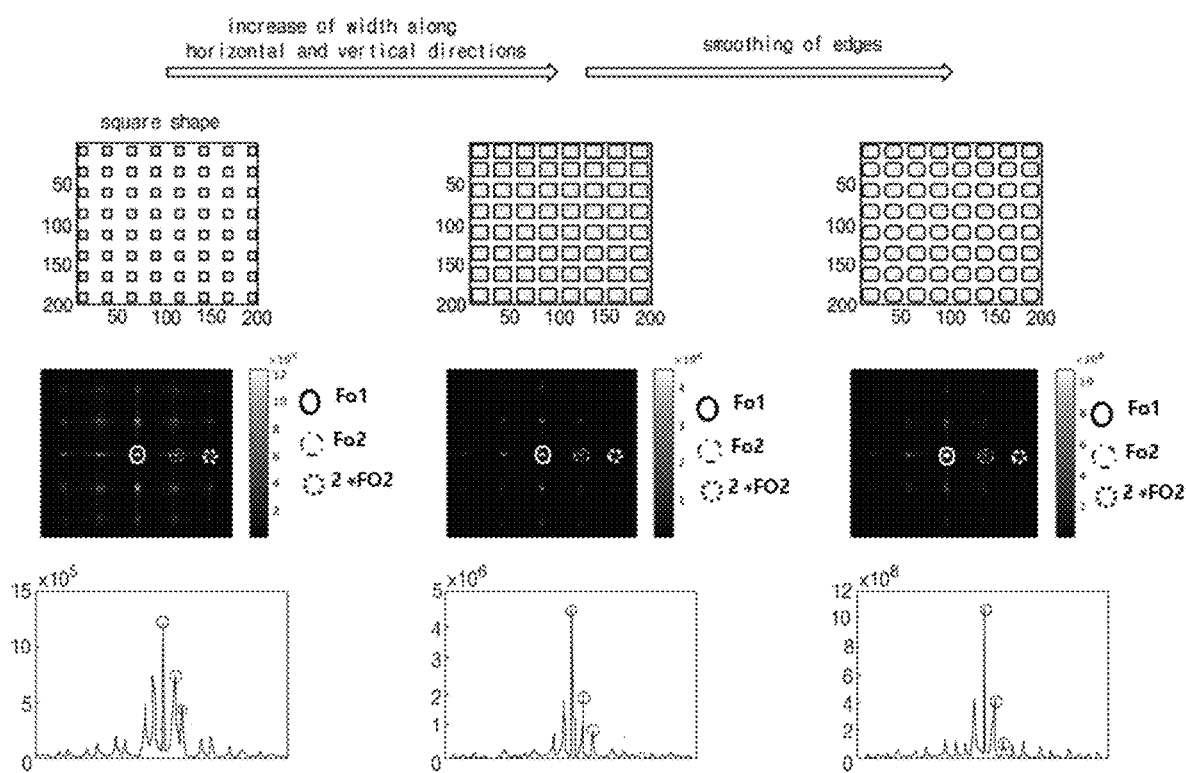
FIG. 12 is a view showing a processing of a first moiré frequency of a method of compensating a display device according to a first embodiment of the present disclosure.

FIG. 12 is a view showing a processing of a first moiré frequency of a method of compensating a display device according to a first embodiment of the present disclosure. The processing of a first moiré frequency will be illustrated with reference to FIGS. 9A to 9C.

In FIG. 12, the first moiré frequencies Fm1 depend on the first and second original frequencies Fo1 and Fo2 and the sensor frequency Fs according to the equation (4). The first original frequency Fo1 is a component generated regardless of a shape of the green emission area of the green subpixel of the display panel 120, and complete elimination of the first original frequency Fo1 is impossible.

Two times of the second original frequency Fo2 (i.e., 2*Fo2) is a high frequency component. The two times of the second original frequency Fo2 (i.e., 2*Fo2) are decreased and the first moiré frequency Fm1 is decreased by increasing a width along the horizontal and vertical directions H and V of the green emission area of the green subpixel of the display panel 120.

For example, in the green emission area of the green subpixel of a square shape having a relatively small width along the horizontal and vertical directions H and V, the first original frequency Fo1 may be disposed at the origin, and the second original frequencies Fo2 and the two times of the second original frequency Fo2 (i.e., 2*Fo2) may be disposed at the X and Y frequency axes. The two times of the second original frequency Fo2 (i.e., 2*Fo2) may have a relatively strong intensity.

In the green emission area of the green subpixel having a relatively great width along the horizontal and vertical directions H and V by increasing a width along the horizontal and vertical directions H and V, the first original frequency Fo1 may be disposed at the origin, and the second original frequencies Fo2 and the two times of the second original frequency Fo2 (i.e., 2*Fo2) may be disposed at the X and Y frequency axes. The two times of the second original frequency Fo2 (i.e., 2*Fo2) may have a relatively weak intensity.

In the green emission area of the green subpixel having a relatively great width along the horizontal and vertical directions H and V and round edges by smoothing edges of a square shape, the first original frequency Fo1 may be disposed at the origin, and the second original frequencies Fo2 and the two times of the second original frequency Fo2 (i.e., 2*Fo2) may be disposed at the X and Y frequency axes. The two times of the second original frequency Fo2 (i.e., 2*Fo2) may have a minimum intensity, and the first moiré frequencies Fm1 may be minimized.

When the width along the horizontal and vertical directions H and V of the green emission area of the green subpixel is increased, an emission area ratio of the red, green and blue subpixels may vary and a color of the displayed image of the display device 110 may be changed unintentionally. As a result, it is limited that the green emission area of the green subpixel is formed to have a square shape having a relatively great width.

However, when the green emission area of the green subpixel is formed to have a cross shape where the width along the horizontal direction H is partially increased and the width along the vertical direction V is partially increased, the two times of the second original frequency Fo2 (i.e., 2*Fo2) and the first moiré frequencies Fm1 may be decreased with the aperture ratio and the emission area ratio of the green emission area of the green subpixel maintained.

Figure 13:
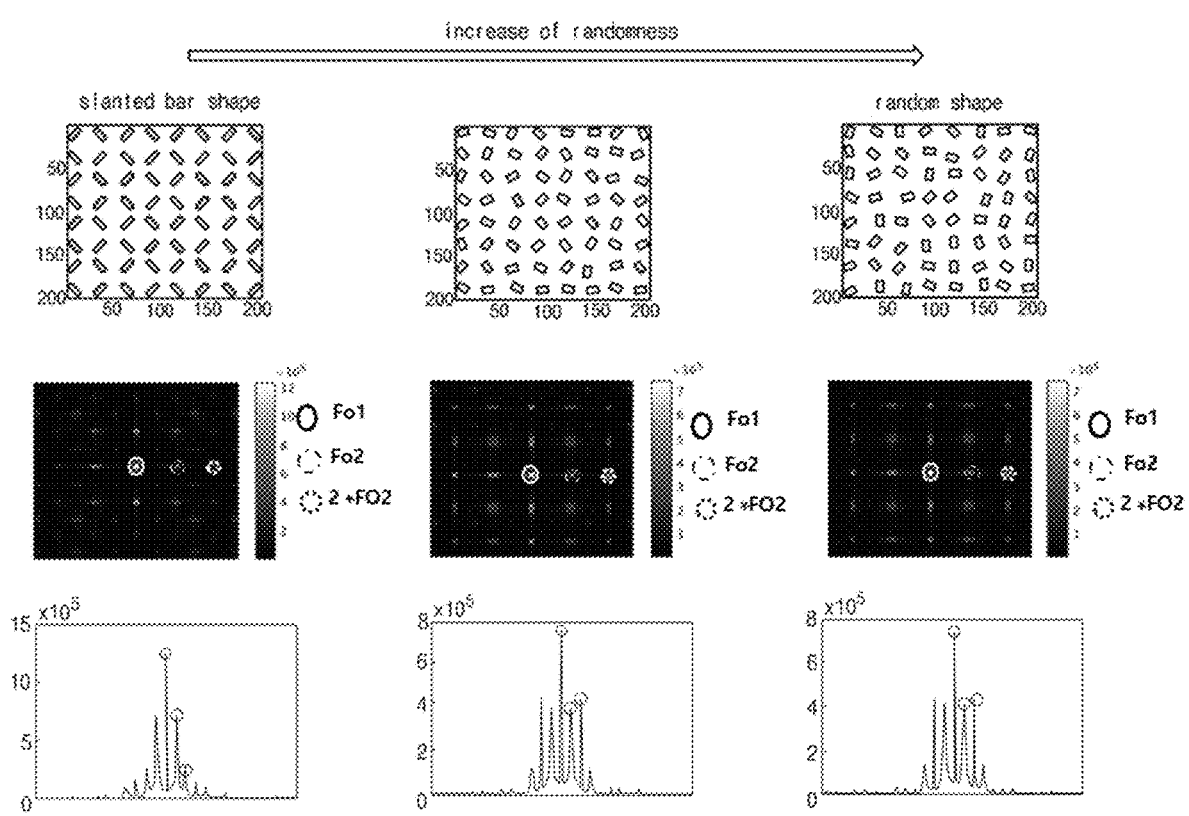
FIG. 13 is a view showing a processing of a first moiré frequency of a method of compensating a display device according to a first embodiment of the present disclosure.

FIG. 13 is a view showing a processing of a first moiré frequency of a method of compensating a display device according to a first embodiment of the present disclosure. The processing of a first moiré frequency will be illustrated with reference to FIGS. 9A to 9C.

In FIG. 13, even when a randomness of a slanted angle of a bar shape is increased in the green emission area of the green subpixel having a slanted bar shape of ±45 degree with respect to the horizontal and vertical directions H and V, the first original frequency Fo1, the second original frequencies Fo2 and the two times of the second original frequency Fo2 (i.e., 2*Fo2) are not eliminated.

However, when the green emission area of the green subpixel is formed to have a cross shape by partially increasing the width along the horizontal direction H and partially increasing the width along the vertical direction V and to have a partially slanted cross shape by assigning a randomness to the cross shape, the two times of the second original frequency Fo2 (i.e. 2*Fo2) and the first moiré frequencies Fm1 may be further decreased with the aperture ratio and the emission area ratio of the green emission area of the green subpixel maintained.

Figure 14:
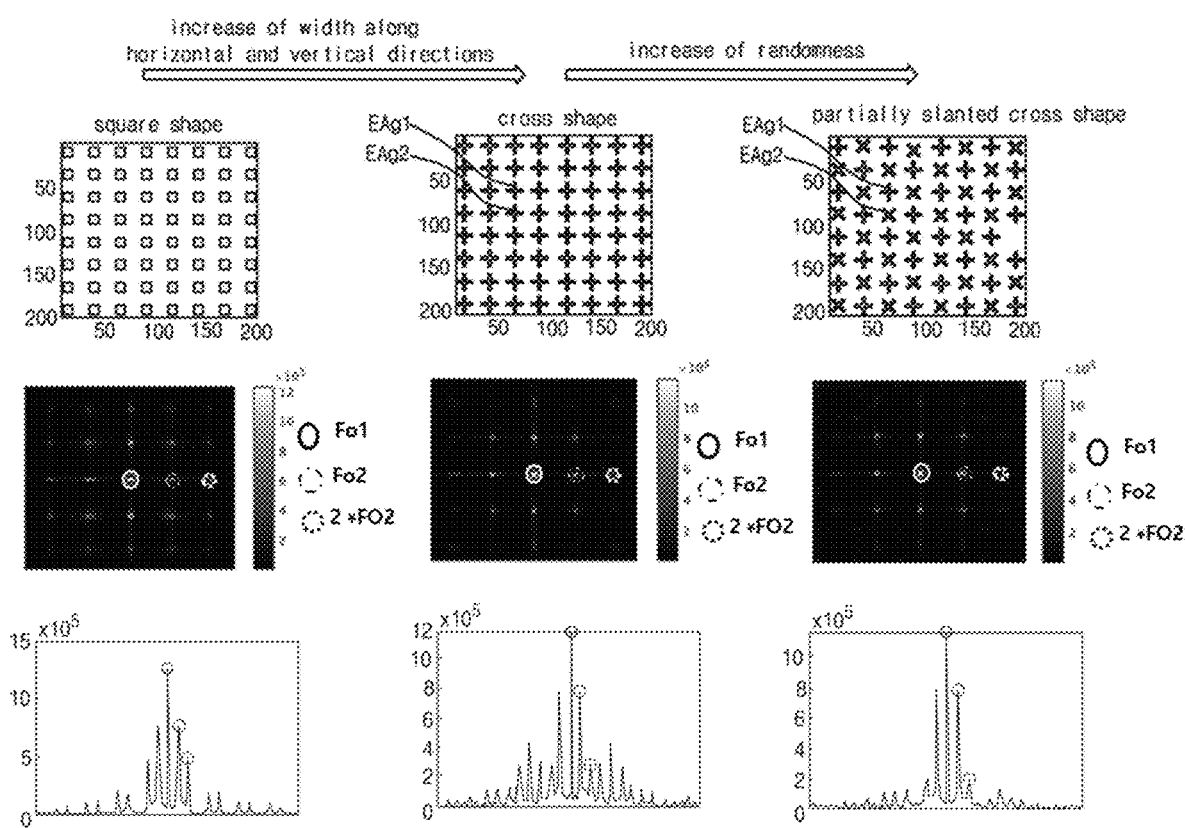
FIG. 14 is a view showing a processing of a first moiré frequency of a method of compensating a display device according to first and second embodiments of the present disclosure.

FIG. 14 is a view showing a processing of a first moiré frequency of a method of compensating a display device according to first and second embodiments of the present disclosure. The processing of a first moiré frequency will be illustrated with reference to FIGS. 9A to 9C.

In FIG. 14, when a shape of the first green and second green emission areas EAg1 and EAg2 of the first green and second green subpixels SPg1 and SPg2 according to a first embodiment of the present disclosure is changed from a square shape to a cross shape where widths along the horizontal and vertical directions H and V are partially increased, the two times of the second original frequency Fo2 (i.e., 2*Fo2) and the first moiré frequencies Fm1 may be decreased with the aperture ratio and the emission area ratio of the first green and second green emission areas EAg1 and EAg2 of the first green and second green subpixels SPg1 and SPg2 maintained.

When a shape of the first green and second green emission areas EAg1 and EAg2 of the first green and second green subpixels SPg1 and SPg2 according to a second embodiment of the present disclosure is changed from a cross shape to a slanted cross shape where a randomness is assigned to the cross shape, the two times of the second original frequency Fo2 (i.e., 2*Fo2) and the first moiré frequencies Fm1 may be further decreased with the aperture ratio and the emission area ratio of the first green and second green emission areas EAg1 and EAg2 of the first green and second green subpixels SPg1 and SPg2 maintained.

An interference fringe such as moiré may be eliminated through a sampling processing for the first green and second green emission areas EAg1 and EAg2 having a cross shape.

Figure 15A:
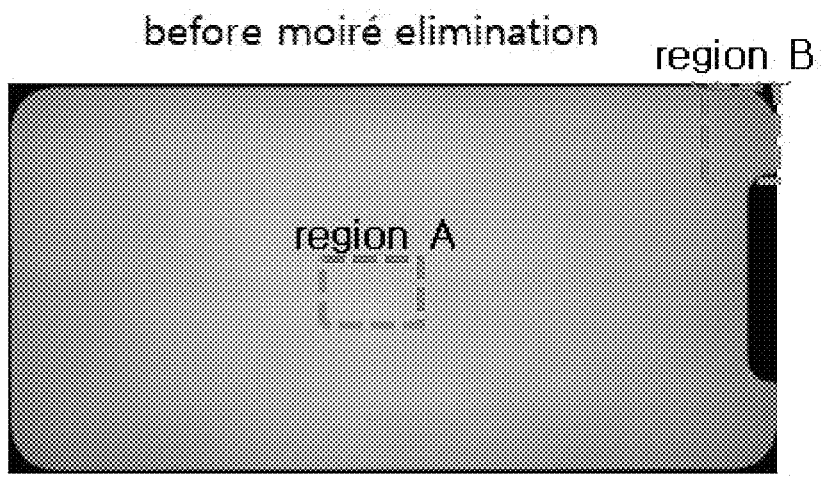
FIGS. 15A and 15B are views showing states before and after moiré elimination, respectively, through a sampling processing to a display device according to first and second embodiments of the present disclosure.
Figure 15B:
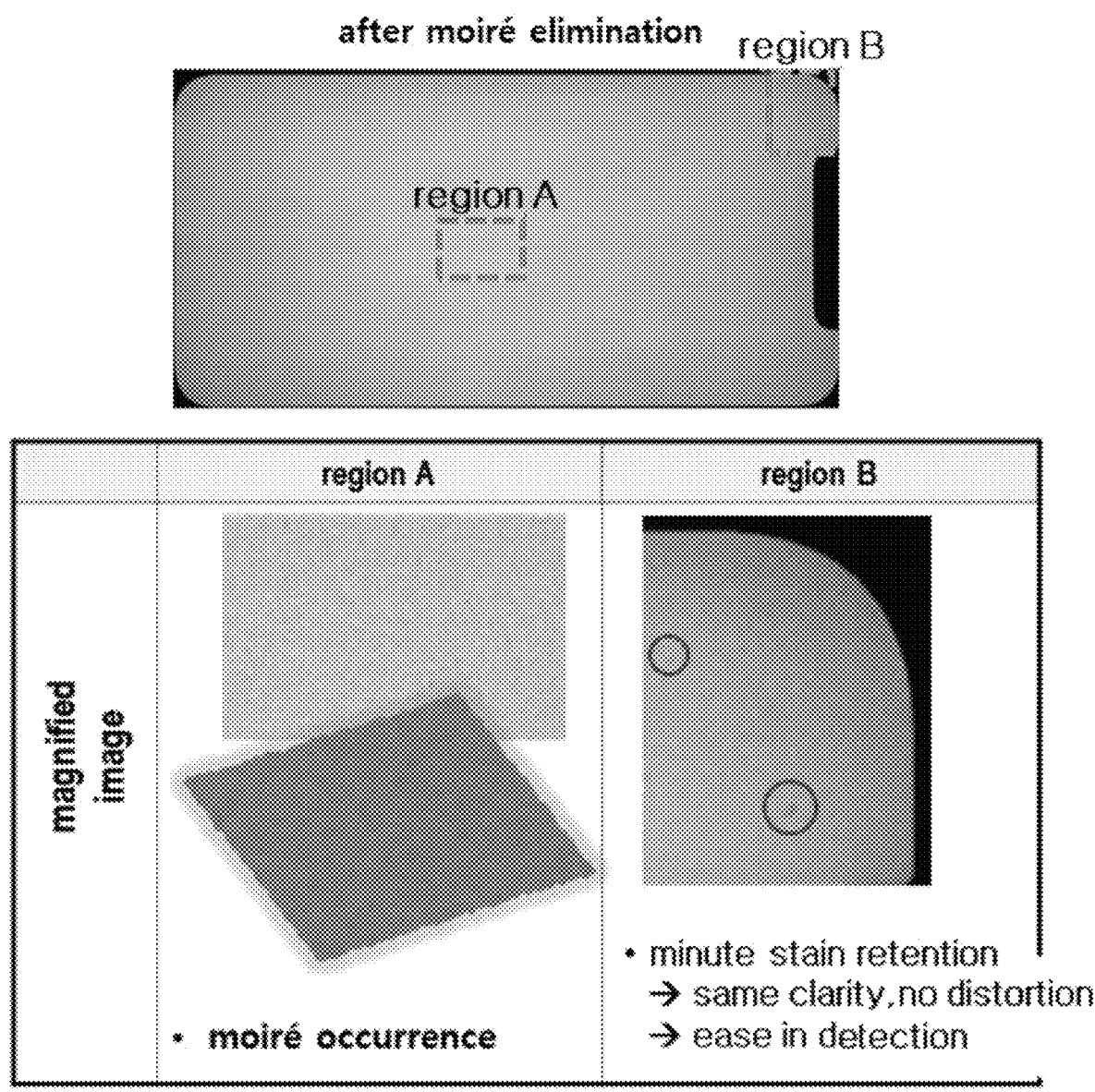

FIGS. 15A and 15B are views showing states before and after moiré elimination, respectively, through a sampling processing to a display device according to first and second embodiments of the present disclosure.

In FIGS. 15A and 15B, a display device 110 according to a first embodiment of the present disclosure includes the first green and second green emission areas EAg1 and EAg2 having a cross shape, and a display device according to a second embodiment of the present disclosure includes the first green and second green emission areas EAg1 and EAg2 having a slanted cross shape.

In FIG. 15A, before a sampling process is performed, a moiré occurs in a region A and a minute stain occurs in a region B of a display device according to first and second embodiments of the present disclosure.

Since the moiré and the minute stain are not clearly distinguished in a frequency domain, it is difficult to detect the minute stain. As a result, the minute stain may not be properly compensated.

In FIG. 15B, after a sampling processing is performed, the moiré occurred in the region A is eliminated and the minute stain occurring in the region B is maintained.

Since a clarity of the displayed image is kept equal without a distortion where the minute stain is eliminated by the sampling processing, the moiré and the minute stain are clearly distinguished in a frequency domain. As a result, the minute stain may be easily detected and may be properly compensated.

Consequently, in the display device according to the first and second embodiments of the present disclosure and the method of compensating the display device, the first green and second green emission areas EAg1 and EAg2 of the first green and second green subpixels SPg1 and SPg2 have a cross shape or a mixture of a cross shape and a slanted cross shape. As a result, the two times of the second original frequency Fo2 (i.e., 2*Fo2) and the first moiré frequencies Fm1 are decreased with the aperture ratio and the emission area ratio of the first green and second green emission areas EAg1 and EAg2 of the first green and second green subpixels SPg1 and SPg2 maintained. As a result, the moiré is eliminated and the minute stain is compensated.

It will be apparent to those skilled in the art that various modifications and variation can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A display device, comprising:
    a substrate including a plurality of pixels, each of the plurality of pixels includes a first subpixel, a second subpixel, a third subpixel, and a fourth subpixel;
    a driving thin film transistor on the substrate, and disposed in each of the first, second, third and fourth subpixels; and
    a light emitting diode on the driving thin film transistor, and connected to the driving thin film transistor,
    wherein the first, second, third and fourth subpixels include a first emission area, a second emission area, a third emission area, and fourth emission area, respectively,
    wherein the first emission area has a cross shape,
    wherein the second emission area has one of a cross shape and a slanted cross shape,
    wherein each of the third and fourth emission areas has a square shape,
    wherein each of the plurality of pixels has a diamond-shape, and
    wherein the first subpixel is disposed at a top portion of the pixel, the second subpixel is disposed at a bottom portion of the pixel, the third subpixel is disposed at a right portion of the pixel, and the fourth subpixel is disposed at left portion of the pixel.

2. The display device of claim 1, wherein each of the first, second, third and fourth subpixels has a diamond-shape.

3. The display device of claim 1, wherein the light emitting diode comprises:
    a first electrode connected to the driving thin film transistor;
    an emitting layer on the first electrode exposed through an opening of a bank layer; and
    a second electrode on the emitting layer,
    wherein the first, second, third and fourth emission areas are defined as the emitting layer of the first, second, third and fourth subpixels, respectively, corresponding to the opening of the bank layer.

4. The display device of claim 1, wherein the first emission area of the first subpixel emits a light of a first green color, the second emission area of the second subpixel emits a light of a second green color, the third emission area of the third subpixel emits a light of a red color, and the fourth emission area of the fourth subpixel emits a light of a blue color.

* * * * *